United States Patent [19]
McClure

[11] Patent Number: 5,446,698
[45] Date of Patent: Aug. 29, 1995

[54] BLOCK DECODED REDUNDANT MASTER WORDLINE

[75] Inventor: David C. McClure, Carrollton, Tex.

[73] Assignee: SGS-Thomson Microelectronics, Inc., Carrollton, Tex.

[21] Appl. No.: 268,788

[22] Filed: Jun. 30, 1994

[51] Int. Cl.[6] .............................................. G11C 7/00
[52] U.S. Cl. ..................... 365/230.03; 365/200; 365/230.06
[58] Field of Search ............... 365/189.01, 230.01, 365/230.02, 900, 200, 230.06

[56] References Cited

U.S. PATENT DOCUMENTS

| | | | |
|---|---|---|---|
| 4,807,191 | 2/1989 | Flannagan | 365/189.01 |
| 5,257,229 | 10/1993 | McClure et al. | 365/200 |
| 5,371,712 | 12/1994 | Oguchi et al. | 365/201 |

*Primary Examiner*—Viet Q. Nguyen
*Attorney, Agent, or Firm*—Renee M. Larson; Lisa K. Jorgenson; Richard K. Robinson

[57] ABSTRACT

According to the present invention, defective element(s), such as a faulty local wordline, of an integrated circuit memory device may be selectively replaced with redundant element(s) in an efficient and flexible manner that does not require replacement of all elements associated with a master element of the memory device, thereby increasing the efficiency with which faulty elements of the memory device may be replaced. For a SRAM having a plurality of blocks, this is accomplished by combining defective block information as well as defective element information, such as bad row information, in the redundant global wordline control circuitry of the device. Then, the "normal" global wordline associated with a faulty local wordline is selectively disabled and a redundant global wordline is selectively enabled, upon detection of the address of the faulty local wordline. The normal global wordline can be enabled when the address corresponds to a non-faulty local wordline.

34 Claims, 3 Drawing Sheets

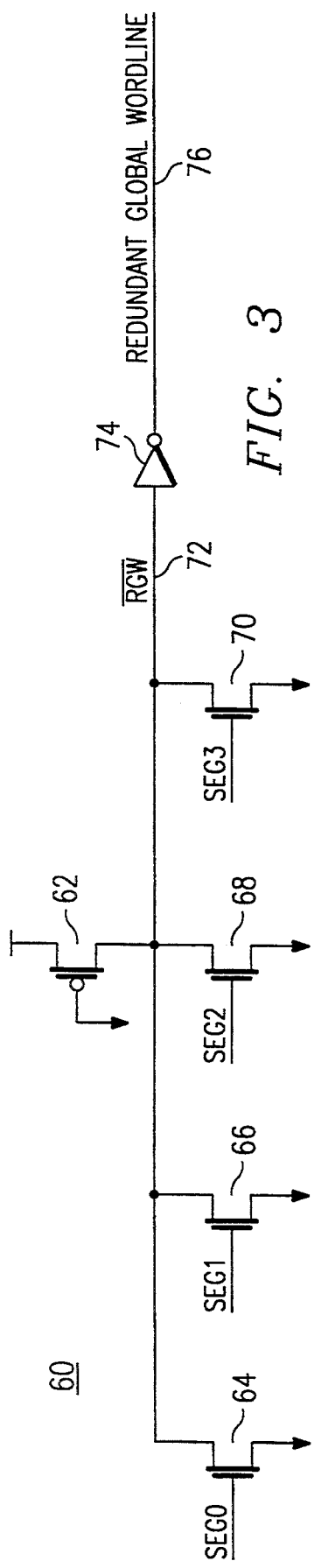
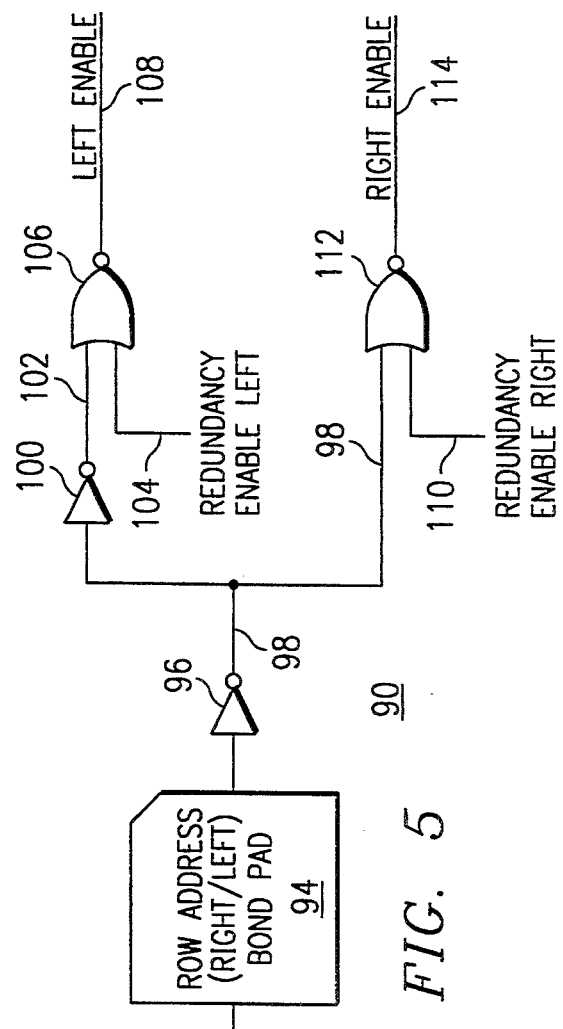

BLOCK DECODED REDUNDANT MASTER WORDLINE

BACKGROUND OF THE INVENTION

The present invention relates generally to integrated circuit memory devices, and more specifically to block decoded redundant master wordlines of integrated circuit memory devices.

In a variety of integrated circuit memory devices, such as static random access memories (SPAMs), including large density SPAMs (1 Meg, 4 Meg, 16 Meg, etc.), synchronous as well as asynchronous memory devices, and even slower commodity memory devices, it is often necessary to replace local wordlines which are faulty with functional redundant local wordlines. In the art, this is often accomplished by replacing all the local wordlines associated with a global wordline of a memory device, even those which are not faulty, with a redundant global wordline and its associated redundant local wordlines. Needless to .say, this way of replacing a faulty local wordline is very inefficient.

Referring to FIG. 1, a block structure 10 of a 1 Meg SRAM memory device is shown. The 1 Meg SRAM has a redundant global wordline 12 which spans across sixteen blocks, as shown, and controls two local wordlines in each block. For instance, Block0 has a local wordline pair comprised of local wordlines LWL00 16 and LWL10 24; Block1 as a local wordline pair comprised of local wordlines LWL01 18 and LWL11 26; Block2 has a local wordline pair comprised of local wordlines LWL02 20 and LWL12 28; finally, Block15 has a local wordline pair comprised of local wordlines LWL015 22 and LWL115 30, as shown. Local wordline decoder 14 decodes a block and its associated even/odd local wordline.

When a bad local wordline is found, all the local wordlines associated with the global wordline, across all sixteen blocks, are replaced by redundant global wordline 12. As is well known in the art, a local wordline is analogous to a row within a block of the memory. Thus, thirty-two local wordlines are replaced by redundant global wordline 12. Since there are 128 cells per local wordline, 4,096 memory cells are swapped in and out for each row repair, when repair using redundancy elements is performed. Note that while only 1 out of the 32 local wordlines might actually be defective, all the local wordlines must be swapped in and out. Thus, this solution offers only very coarse granularity with regard to the replacement of defective elements of a memory device.

Thus, there exists a current need in the art to be able to replace defective elements of an integrated circuit memory device, such as defective local wordlines of a SRAM, with redundant elements in a manner which does not require replacement of all like elements of the memory device.

SUMMARY OF THE INVENTION

It would be advantageous in the art to be able to selectively replace defective elements of an integrated circuit memory device with redundant elements, Therefore, according to the present invention, defective element(s) of an integrated circuit memory device may be selectively replaced with redundant element(s) in an efficient and flexible manner that does not require replacement of all elements associated with a master element of the, memory device, thereby increasing the efficiency with which faulty elements may be replaced.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 3 is circuitry for summing segment address signals, according to the present invention;

FIG. 4 is circuitry for summing redundant global wordline enable signals, according to the present invention;

FIG. 5 is circuitry for jamming the appropriate polarity of the left/right address of a memory array, according to the present invention.

DESCRIPTION OF THE INVENTION

The present invention represents a substantial improvement over the prior art means of replacing defective memory elements of an integrated circuit memory device. Using the present invention, it is possible to increase the efficiency with which defective memory elements may be replaced with redundant memory elements, based on yield limitations and defects of the memory device.

According to the prior art discussed above in the Background of the Invention, when a defective memory element, such as a bad local wordline or row of a static random access memory (SRAM) is found in a block, the bad local wordline and its associated wordline of a wordline pair must be replaced by a redundant memory element which spans multiple blocks of the memory device. For a 1 Meg SRAM, for instance, a global wordline which spans all sixteen blocks of the memory device is replaced by a redundant global wordline. Thus, thirty two local wordlines are swapped in and out at a time. Since there are 128 cells per local wordline, 4,096 memory cells are swapped in and out for each row repair which uses redundancy. Note that while only 1 of the 32 local wordlines may actually be defective, all 32 of the local wordlines must be replaced by the redundant global wordline..

While the prior art approach may be characterized as having coarse redundant global wordline granularity since whenever a bad row, or other defective memory element, must be replaced all local wordlines must also be replaced, the present invention results in finer granularity of cells which are swapped so as to provide improved efficiency. The degree of redundant global wordline granularity may be selectively chosen to be ½, ¼, ⅛, or 1/16 of an entire global wordline, for instance, of the coarser prior art granularity; thus, by selectively choosing the desired redundant global wordline granularity, the redundant global wordline need not be decoded down to the individual block level. This finer granularity may be achieved by combining defective block information as well as row information in the redundant global wordline control circuitry.

Figure 1:
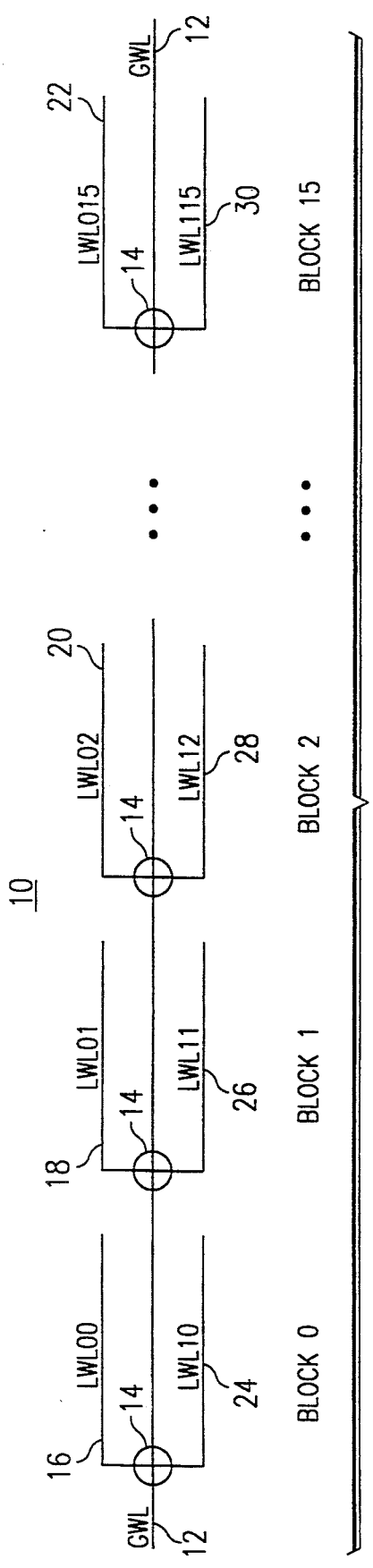
FIG. 1 is a block structure of a 1 Meg SRAM memory device, according to the present invention.
Figure 2:
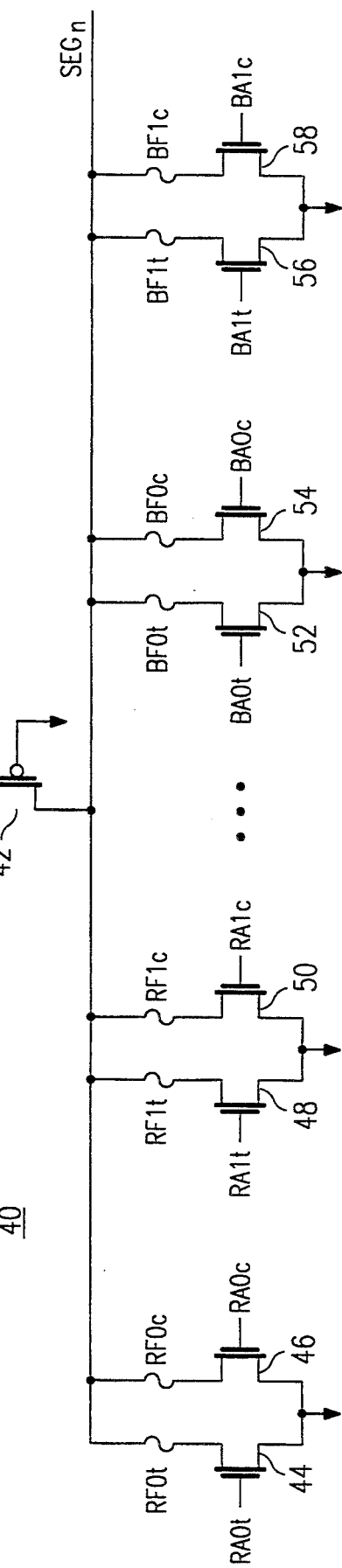
FIG. 2 is circuitry for providing block information, according to the present invention.

As an example, assume that the redundant global wordline of a 1 Meg SRAM is effectively segmented into four block segments instead of the sixteen shown in FIG. 1. First, block information must be provided for each segment. This may be accomplished a number of ways, but it is important that summing information be quickly provided. Referring to FIG. 2, segment information circuitry 40 illustrates a way of providing block information for one segment, according to the present invention. For a segment having 0 to n row addresses, row address pairs are comprised of a row address true signal and a row address complement signal which feed the gates of corresponding n-channel transistors, which are in turn connected to corresponding fuses. For instance, for row address 0, row address0 true signal RA0t feeds the gate of n-channel transistor 44 while row address0 complement signal RA0c feeds the gate of n-channel transistor 46. A first source/drain of n-channel transistor 44 is connected to fuse RF0t while; a second source/drain of n-channel transistor 44 is connected to a voltage level, such as ground. Likewise, a first source/drain of n-channel transistor 46 is connected to fuse RF0c while a second source/drain of n-channel transistor 46 is connected to ground. This defines the row address pair for row address0. For row address 1, row address1 true signal RA1t feeds the gate of n-channel transistor 48 while row address1 complement signal RA1c feeds the gate of n-channel transistor 50. A first source/drain of n-channel transistor 48 is connected to fuse RF1t wile a second source/drain of n-channel transistor 48 is connected to ground; a first source/drain of n-channel transistor 50 is connected to fuse RF1c while a second source/drain of n-channel transistor 50 is connected to ground. This defines the row address pair for row address1. As indicated by the three dots, there may be up to n row address pairs, where n denotes the number of row addresses in the segment.

In addition to row address pairs, segment information circuitry 40 also has block address pairs for the one segment. The first block address pair for block address0 is defined as follows. Block address0 true signal BA0t feeds the gate of n-channel transistor 52. A first source/drain of transistor 52 is connected to fuse BF0t while a second source/drain of transistor 52 is connected to ground. Block address0 complement signal BA0c feeds the gate of n-channel transistor 54. A first source/drain of transistor 54 is connected to fuse BF0c while a second source/drain of transistor 54 is connected to ground. Similarly, the second block address pair for block address1 is defined as follows: Block address1 true signal BA1t feeds the gate of n-channel transistor 56. A first source/drain of transistor 56 is connected to fuse BF1t while a second source/drain of transistor 56 is connected to ground. Block address1 complement signal BA1c feeds the gate of n-channel transistor 58. A first source/drain of transistor 58 is connected to fuse BF1c while a second source/drain of transistor 58 is connected to ground. The block address pairs for block address0 and block address 1 together define four of the sixteen blocks of a 1 Meg SRAM.

A terminal of each of the fuses of the row address pairs and the block address pairs, and pull-up p-channel transistor 42 are connected together to form segment address signal SEGn as shown. For a given row or block address pair, either the true fuse or the complement fuse is blown such that when a replaced address is presented, segment address signal SEGn is a high logic level. Thus, segment address signal SEGn embodies the block information for segment n, providing important information such as the identity of faulty elements in segment in which must be replaced. Through the use of fuses., information is permanently programmed into the segment information circuitry 40.

For a 1 Meg SRAM having 16 blocks, there will be a total of 4 segments, each having circuitry analogous to segment circuitry 40 of FIG. 2. Thus there are four segment address signals analogous to SEGn for the redundant global wordline, and these four segment address signals must be summed together for the redundant global wordline of the ,device. Referring to FIG. 3, circuitry 60 which sums these segment address signals is shown. The four segment address signals for the 1 Meg SRAM are SEG0, SEG1, SEG2, and SEG3, and each segment address signal embodies block information for ills respective segment. Segment address signals SEG0, SEG1, SEG2, and SEG3 are feed to the gates of n-channel transistors 64, 66, 68, and 70, respectively. A first source/drain of transistors 64, 66, 68, and 70 and pull-up transistor 62 are connected together to form redundant global wordline bar signal 72. Redundant global wordline bar signal 72 is inverted by inverter 74 to produce redundant global wordline signal 76. As will be appreciated by one skilled in the art, there are other ways in which segment address signals SEG0, SEG1, SEG2, and SEG3 may be summed in addition to circuitry 60 of FIG. 3.

According to the present invention, if two or more redundant global wordlines are being used (or used for each half of the memory device matrix), then it is necessary to sum all the redundant global wordline enables. Referring to FIG. 4, circuitry 80 for summing all the redundant global wordline enables for a given integrated circuitry memory device is shown. Assuming there are two redundant global wordlines for the device, redundant global wordline0 bar signal 82 and redundant global wordline1 bar signal 84 are two input signals to NAND gate 86, which is turn generates redundancy enable signal 88, as shown. Redundancy enable signal 88 is used to selectively disable faulty local wordlines associated with the normal global wordline of the device. Note that FIG. 4 shows wire-NOR logic; conventional NAND/NOR summing logic may also be employed. As will be appreciated by one skilled in the art, there are additionally other circuitries which may be used to sum the redundant global wordline enables of a memory device in addition to circuitry 80 of FIG. 4 or conventional NAND/NOR summing logic. However, regardless of which summing circuitry is used, it is important that the normal global wordline path is quickly disabled to avoid glitching and partial wordline select on the faulty segment which must be disabled and replaced. Thus, fuses used in the prior art can no longer be used to disable faulty global wordline segments. The normal global wordline can be enabled when the addresses corresponding to a non-faulty local wordline is presented.

In addition to providing block information for each segment, portions, such as local wordlines, of the "normal" global wordline shown as global wordline 12 of FIG. 1, as opposed to the redundant global wordline, must be able to be selectively disabled since potentially only ¼, ⅛, etc. of the normal global wordline need be replaced according to the present invention. Before, using the prior art circuitry, the entire global wordline would need to be replaced, such that a fuse was commonly used to disconnect the entire global wordline and leave it in a disabled state, such as Vss.

Various means may be used to selectively disable the normal global wordline. If the redundancy elements are only associated with half of the memory array, either right or left, then the appropriate polarity of the left/right address can be disabled or jammed. Referring to FIG. 5, circuitry 90 provides the means for jamming the appropriate polarity of the left/right address of a memory array where redundancy elements are associated with half of the array. Row address signal 92 is fed to row address(left/right) bond pad 94 and then to inverter 96 which in turn generates signal 98. In order to generate left enable signal 108, which allows the left side of the memory array to be enabled, signal 98 is inverted by inverter 100 to generate signal 102. Signal 102, together with redundancy enable left signal 104, is fed to NOR gate 106 which generates left enable signal 108. In order to generate right enable signal 114, which allows the right side of the memory array to be enabled, signal 98 and redundancy enable right signal 110 are fed to NOR gate 112 which generates right enable signal 114 as shown. Thus, by controlling the state of redundancy enable left signal 104 and redundancy enable right signal 110, the polarity of the address may be disabled or jammed. Redundancy enable left signal 104 and redundancy enable right signal 110 are each analogous to redundancy enable signal 88 of FIG. 4. Thus, the redundancy enable signal 88 of FIG. 4 may be thought of as representing either the left or right half of the memory array for purposes of this illustration. The actual redundant element should see a non-jammed version of the address.

The circuitry 90 of FIG. 5 may be used to provide the circuitry of FIG. 2 with even finer granularity. The even/odd row address idea may be embodied in FIG. 2 so that the even/odd control in each block may be jammed or disabled for the normal wordline to ensure that the normal wordline is off. This allows replacement of either the even local wordline or the odd local wordline of a local wordline pair rather than replacing both the even and odd local wordlines of the local wordline pair. Referring to FIG. 1, for instance, only local wordline LWL00 16 or LWL10 24 of the local wordline pair of Block0 need be replaced. Replacing one rather than two local wordlines is much more efficient.

Figure 6A:
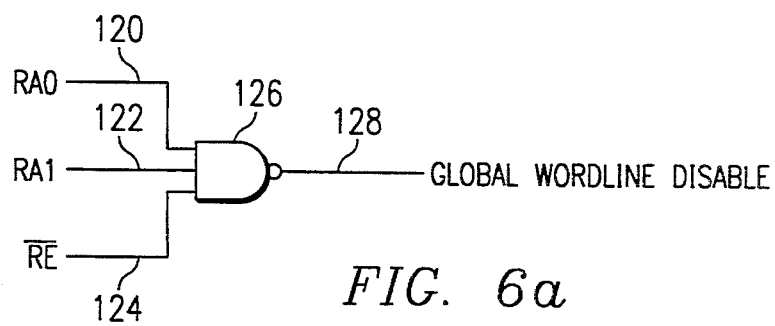
FIG. 6a is circuitry, of a first type, for selectively disabling a portion of the normal global wordline.
Figure 6B:
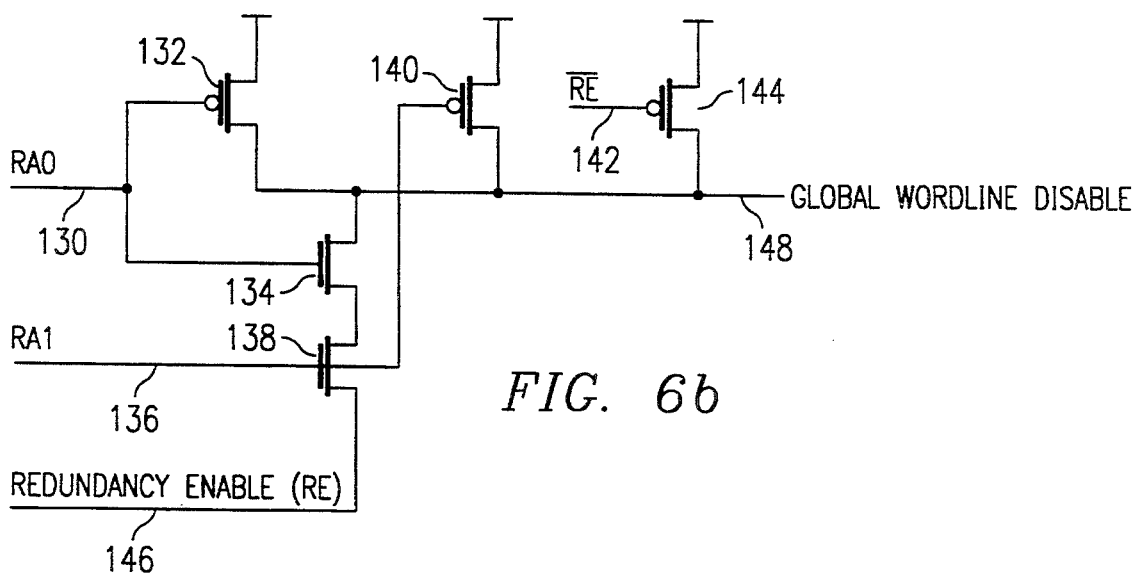
FIG. 6b is circuitry, of a second type, for selectively disabling a portion of the normal global wordline.

Another way to selectively disable a local wordline or other portion of the normal global wordline is to make the predecoding or decoding a function of the redundancy enable. FIGS. 6a and 6b show two ways in which this may be accomplished. In FIGS. 6a and 6b, it is assumed that NAND gates are used in the predecoder or global decoder circuitry of the memory device. Referring to FIG. 6a, a plurality of row address signals, such as row address0 signal 120, row address1 signal 122, and redundancy enable bar signal 124 are each input signals to NAND gate 126 which uses these signals to generate the proper state of global wordline disable signal 128. Referring to FIG. 6b, another circuit for generating a global wordline disable signal using transistor logic is shown. Row address0 signal 130 is fed to the gate of p-channel transistor 132 and the gate of n-channel transistor 134. Row address1 signal 136 is fed to the gate of n-channel transistor 138 and to the gate of p-channel transistor 140. Redundancy enable signal 146 is connected to a source/drain of transistor 138 and acts as a pseudo ground which is fed to one or more decoders, or perhaps all decoders if this is the global wordline decoder. Redundancy enable bar signal 142 drives the gate of p-channel transistor 144. A source/drain of transistor 134 and a source/drain of transistor 138 are connected to each other. As shown, a source/drain of transistors 133, 134, 140, and 144 are connected together to define global wordline disable signal 148. The other source/drains of transistor 132, 140, and 144 are connected to a power supply, such as Vcc, as shown. Using the circuitry of either FIG. 6a or 6b, it is not necessary to use fuses to disconnect the bad global wordline.

Figure 7:
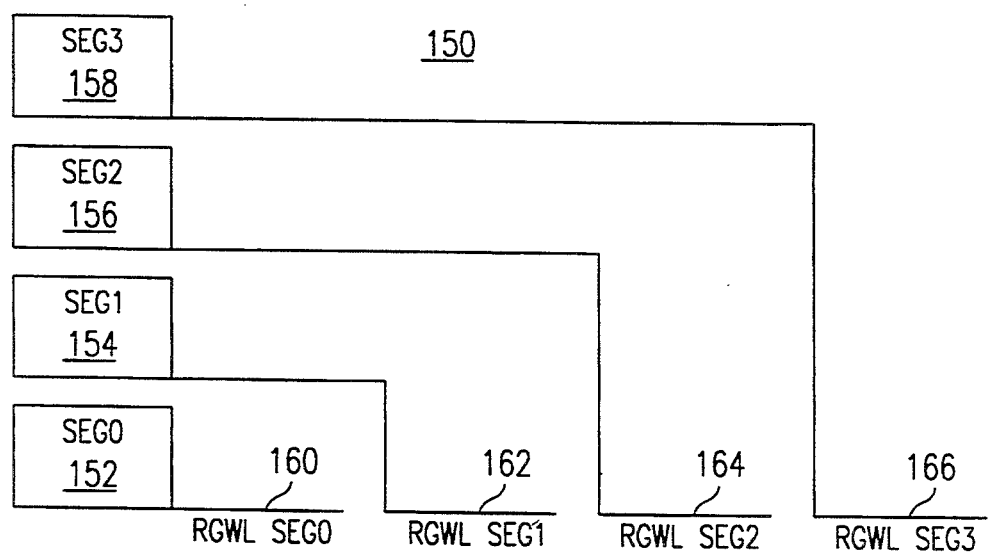
FIG. 7 is a block diagram showing unique redundant global wordline segments, according to the present invention.

Additionally, in the 1 Meg SRAM example, it is possible to have four unique redundant global wordline segments instead of summing all associated redundant global wordline segments into one redundant global wordline as was shown in FIG. 3. Thus, the redundant global wordline would actually be comprised of four unique segments as shown in FIG. 7. SEG0 block 152, SEG1 block 154, SEG2 block 156, and SEG3 block 158 each contain circuitry analogous to segment information circuitry 40 of FIG. 2 and are used to drive redundant global wordline segment0 160, redundant global wordline segment1 162, redundant global wordline segment2 164, and redundant global wordline segment3 166, respectively. Using the unique redundant global wordline segments 160, 162, 164, and 166, of FIG. 7, it is not necessary to employ the summing circuitry of FIG. 3 to generate a composite redundant global wordline.

The present invention provides several advantages over the prior art way of using redundant elements to replace faulty elements of an integrated circuit memory device, such as a 1 Meg SRAM. The old method required replacing 32 local wordlines for each bad local wordline, in the case of the 1 Meg SRAM example. The present invention offers the improvement of potentially having to replace only one local wordline for each bad local wordline. Obviously, tradeoffs, such as summing logic, layout area, speed, and complexity of circuitry, exist for achieving a desired level of granularity. However, the flexibility and efficiency afforded by the present invention may outweigh these tradeoffs. Additionally, the present invention would be beneficial in a variety of integrated circuit memory devices, including but not limited to synchronous as well as asynchronous devices, large density SPAMs (1 Meg, 4 Meg, 16 Meg, etc.), and yield sensitive commodity devices.

While the invention has been particularly shown and described with reference to a preferred embodiment, it will be understood by those skilled in the art that various changes in form and detail may be made therein without departing from the spirit and scope of the invention.

What is claimed is:

1. A structure for replacing faulty elements of an integrated circuit memory device with redundant elements, comprising:
   a memory array organized in a plurality of memory blocks which are grouped in a plurality of memory segments, wherein a memory segment has one or more memory blocks;
   a plurality of global wordlines, wherein a global wordline spans the plurality of memory blocks of the memory array and has a plurality of local wordlines associated with a memory block, and wherein the global wordline may have one or more faulty local wordlines associated with at least one memory segment;

a plurality of segment information circuits, wherein a segment information circuit products an output signal which provides a block information of the memory segment, wherein the block information defines one or more local wordlines of the memory segment and the output signal is formed by a plurality of row addresses and a plurality of block addresses; and a redundant global wordline, having a plurality of redundant local wordlines, which may be enabled to replace the faulty local wordlines associated with the global wordline upon receipt of one or more addresses of the memory segment which are associated with the faulty local wordlines.

2. The structure of claim 1, wherein the redundant global wordline is enabled to replace the faulty local wordlines associated with the global wordline upon receipt of the output signal from the segment information circuit formed by the row addresses and block addresses corresponding to the faulty local wordlines.

3. The structure of claim 1, wherein the redundant global wordline is enabled to replace the faulty local wordlines associated with the global wordline which are contained in more than one memory segment.

4. The structure of claim 1, wherein the redundant global wordline is defined by summing together the output signals associated with the plurality of segment information circuits, wherein each segment information circuit is associated with a different memory segment.

5. The structure of claim 1, wherein the block information of the memory segment is permanently programmed into the segment information circuit.

6. The structure of claim 1, wherein the faulty local wordlines associated with the global wordline are selectively disabled by summing together the plurality of redundant local wordlines with a summing means which produces a global redundancy enable signal.

7. The structure of claim 6, wherein a plurality of signals associated with the plurality of redundant local wordlines are input signals to a logic gate which generates the global redundancy enable signal.

8. The structure of claim 7, wherein the logic gate is a NAND gate.

9. The structure of claim 6, wherein the global redundancy enable signal is an input signal to decoding logic which determines whether the faulty local wordlines associated with the global wordline are selectively disabled.

10. The structure of claim 1, wherein the faulty local wordlines associated with the global wordline are selectively disabled by jamming an appropriate polarity of an address associated with the faulty local wordlines.

11. The structure of claim 10, wherein jamming an appropriate polarity of an address associated with the faulty local wordlines allows the redundant global wordline to be enabled.

12. The structure of claim 10, wherein the redundant global wordline is segmented into a plurality of redundant wordline segments, wherein each redundant wordline segment corresponds to a memory segment.

13. The structure of claim 1, wherein, if a redundant wordline is associated with half of the memory array, the faulty local wordlines associated with the global wordline may be selectively disabled by jamming an appropriate polarity of a left/right address signal of the memory array.

14. The structure of claim 1, wherein the redundant global wordline is segmented into a plurality of redundant wordline segments, wherein each redundant wordline segment corresponds to a memory segment.

15. The structure of claim 1, wherein the redundant global wordline can replace faulty local wordlines associated with the plurality of global wordlines, and wherein the faulty local wordlines reside in more than one memory segment and are associated with more than one global wordline.

16. The structure of claim 1, wherein the global wordline may be enabled upon receipt of one or more addresses of the memory segment which are not associated with the faulty local wordlines.

17. The structure of claim 1, wherein the global wordline may be selectively disabled upon receipt of one or more addresses of the memory segment associated with the faulty local wordlines.

18. A method of replacing faulty elements of an integrated circuit memory device with redundant elements, comprising the steps of:

identifying one or more faulty local wordlines associated with a global wordline of a plurality of global wordlines through the use of a plurality of segment information circuits, wherein the global wordline spans a plurality of memory blocks of a memory array organized in a plurality of memory blocks which are grouped in a plurality of memory segments wherein a memory segment has one or more memory blocks; and wherein a segment information circuit produces an output signal which provides a block information of the memory segment, wherein the block information defines one or more local wordlines of the memory segment and the output signal is formed by a plurality of row addresses and a plurality of block addresses;

selectively disabling the faulty local wordlines associated with the global wordline upon receipt of one or more addresses of the memory segment which are associated with the faulty local wordlines; and selectively enabling a redundant global wordline, having a plurality of redundant local wordlines.

19. The method of claim 18, wherein the redundant global wordline is enabled to replace the faulty local wordlines associated with the global wordline upon receipt of the output signal from the segment information circuit formed by the row addresses and block addresses corresponding to the faulty local wordlines.

20. The method of claim 18, wherein the redundant global wordline is enabled to replace the faulty local wordlines associated with the global wordline which are contained in more than one memory segment.

21. The method of claim 18, wherein the redundant global wordline is defined by summing together the output signals associated with the plurality of segment information circuits, wherein each segment information circuit is associated with a different memory segment.

22. The method of claim 18, wherein the block information of the memory segment is permanently programmed into the segment information circuit.

23. The method of claim 18, wherein the faulty local wordlines associated with the global wordline are selectively disabled by summing together the plurality of redundant local wordlines with a summing means which produces a global redundancy enable signal.

24. The method of claim 23, wherein a plurality of signals associated with the plurality of redundant local wordlines are input signals to a logic gate which generates the global redundancy enable signal.

25. The method of claim 24, wherein the logic gate is a NAND gate.

26. The method of claim 23, wherein the global redundancy enable signal is an input signal to decoding logic which determines whether the faulty local wordlines associated with the global wordline are selectively disabled.

27. The method of claim 18, wherein the faulty local wordlines associated with the global wordline are selectively disabled by jamming an appropriate polarity of an address associated with the faulty local wordlines.

28. The method of claim 27, wherein jamming an appropriate polarity of an address associated with the faulty local wordlines allows the redundant global wordline to be enabled.

29. The method of claim 27, wherein the redundant global wordline is segmented into a plurality of redundant wordline segments, wherein each redundant wordline segment corresponds to a memory segment.

30. The method of claim 18, wherein, if a redundant wordline is associated with half of the memory array, the faulty local wordlines associated with the global wordline may be selectively disabled by jamming an appropriate polarity of a left/right address signal of the memory array.

31. The method of claim 18, wherein the redundant global wordline is segmented into a plurality of redundant wordline segments, wherein each redundant wordline segment corresponds to a memory segment.

32. The method of claim 18, wherein the redundant global wordline can replace faulty local wordlines associated with the plurality of global wordlines, and wherein the faulty local wordlines reside in more than one memory segment and are associated with more than one global wordline.

33. The method of claim 18, wherein the global wordline may be enabled upon receipt of one or more addresses of the memory segment which are not associated with the faulty local wordlines.

34. The method of claim 18, wherein the global wordline may be selectively disabled upon receipt of one or more addresses of the memory segment associated with the faulty local wordlines.

* * * * *

UNITED STATES PATENT AND TRADEMARK OFFICE
CERTIFICATE OF CORRECTION

PATENT NO. : 5,446,698

DATED: : August 29, 1995

INVENTOR(S) : David C. McClure

It is certified that error apears in the above-identified patent and that said Letters Patent is hereby corrected as shown below:

Claim 1, line 16, change "products" to --produces--.

Signed and Sealed this

Twenty-eighth Day of October, 1997

Attest:

BRUCE LEHMAN

Attesting Officer

Commissioner of Patents and Trademarks